United States Patent [19]
Mendel

[11] Patent Number: 6,034,540
[45] Date of Patent: Mar. 7, 2000

[54] PROGRAMMABLE LOGIC INTEGRATED CIRCUIT ARCHITECTURE INCORPORATING A LONELY REGISTER

[75] Inventor: David W. Mendel, Sunnyvale, Calif.

[73] Assignee: Altera Corporation, San Jose, Calif.

[21] Appl. No.: 08/835,552

[22] Filed: Apr. 8, 1997

Related U.S. Application Data

[60] Provisional application No. 60/011,422, Apr. 9, 1996, and provisional application No. 60/014,629, Apr. 9, 1996.

[51] Int. Cl.[7] .................................................. H03K 19/20
[52] U.S. Cl. ............................................. 326/39; 326/41
[58] Field of Search .......................................... 326/37–41

[56] References Cited

U.S. PATENT DOCUMENTS

| | | | |
|---|---|---|---|
| 4,609,986 | 9/1986 | Hartmann et al. | 364/200 |
| 4,617,479 | 10/1986 | Hartmann et al. | 307/465 |
| 4,677,318 | 6/1987 | Veenstra et al. | 307/465 |
| 4,713,792 | 12/1987 | Hartmann et al. | 364/900 |
| 4,871,930 | 10/1989 | Wong et al. | 307/465 |
| 4,899,067 | 2/1990 | So et al. | 307/465 |
| 4,903,223 | 2/1990 | Norman et al. | 364/716 |
| 4,912,342 | 3/1990 | Wong et al. | 307/465 |
| 5,046,035 | 9/1991 | Jigour et al. | 326/39 |
| 5,121,006 | 6/1992 | Pedersen et al. | 307/465 |
| 5,231,588 | 7/1993 | Agrawal et al. | 326/41 |
| 5,241,224 | 8/1993 | Pedersen et al. | 307/465 |
| 5,247,195 | 9/1993 | Turner et al. | 326/83 |
| 5,260,610 | 11/1993 | Pedersen et al. | 307/465 |
| 5,260,611 | 11/1993 | Cliff et al. | 307/465 |
| 5,343,406 | 8/1994 | Freeman et al. | 326/38 |
| 5,350,954 | 9/1994 | Patel et al. | 307/465 |
| 5,371,422 | 12/1994 | Patel et al. | 326/41 |
| 5,384,500 | 1/1995 | Hawes et al. | |
| 5,399,922 | 3/1995 | Kiani et al. | 326/40 |
| 5,436,514 | 7/1995 | Agrawal et al. | 326/41 |
| 5,473,266 | 12/1995 | Ahanin et al. | 326/41 |
| 5,504,440 | 4/1996 | Sasaki | 326/39 |
| 5,546,018 | 8/1996 | New et al. | 326/38 |
| 5,757,207 | 5/1998 | Lytle et al. | 326/39 |
| 5,809,281 | 9/1998 | Steele et al. | 326/39 |
| B1 4,617,479 | 9/1993 | Hartmann et al. | 307/465 |

FOREIGN PATENT DOCUMENTS 0 227 329  7/1987  European Pat. Off. .

OTHER PUBLICATIONS

Altera Corp., *1996 Data Book,* Chapter 5 "Max 7000," pp. 191–219 (Jun. 1996).
Xilinx Corp., *The Programmable Logic Data Book,* "XC4000, XC4000A, XC4000H Logic Cell Array Families," pp. 2–7–2–46 (1994). No month.
Xilinx Corp., *The Programmable Logic Data Book,* "XC3000, XC3000A, XC3000L, XC3100, XC3100A Logic Cell Array Families," pp. 2–105–2–152 (1994). No month.
Altera Corp., "Flex 8000 Programmable Logic Device Family" data sheet, pp. 1–22 (version 4, Aug., 1994).
Xilinx Corp., *The Programmable Logic Data Book,* "XC5200 Logic Cell Array Family," pp. 1–42 (Preliminary (v2.0), May 1995).
Altera Corp., *1993 Data Book,* "MAX 7000 Programmable Logic Device Family" data sheet, Aug. 1993, ver. 1, pp. 69–81.
Altera Corp., "FLEX 10K Embedded Programmable Logic Family" data sheet, Jul. 1995, ver. 1, pp. 1–56.
Altera Corp., *1995 Data Book,* "MAX 9000," Mar. 1995, pp. 119–148.

*Primary Examiner*—Michael Tokar
*Assistant Examiner*—Don Phu Le
*Attorney, Agent, or Firm*—Townsend and Townsend and Crew LLP

[57] ABSTRACT

A logic element for a programmable logic device to implement a lonely register architecture. The logic element includes logic modules (P0–P4) for implementing combinatorial logic and a register (445). The combinatorial and registered paths of a logic element may be utilized at the same time. The logic modules may be programmably coupled to the register. The output of the register may be programmably coupled through an output buffer (515) to an I/O pad (520) of the integrated circuit. The logic modules may bypass the register and directly programmably couple through the output buffer to the I/O pad. A logic module may be used as a shareable expander by programmably coupling the module through to a global interconnect with other logic modules in LABs coupled to the global interconnect.

17 Claims, 5 Drawing Sheets

PROGRAMMABLE LOGIC INTEGRATED CIRCUIT ARCHITECTURE INCORPORATING A LONELY REGISTER

This application claims the benefit of a provisional application No. 60/011,422, filed Apr. 9, 1996, and a provisional application No. 60/014,629, filed Apr. 9, 1996, both incorporated herein by reference.

BACKGROUND OF THE INVENTION

The present invention relates to the field of integrated circuits and their operation. More specifically, in one embodiment the invention provides an improved logic device, as well as an improved method of operating a logic device.

Logic devices and methods of their operation are well known to those of skill in the art. Programmable logic devices have found particularly wide application as a result of their combined low up-front cost and versatility to the user.

Altera's FLEX® and MAX® lines of programmable logic are among the most advanced and successful programmable logic devices. In the FLEX® 8000 logic devices, for example, a large matrix of logic elements (LEs) is utilized. In one commercial embodiment of such devices, each LE includes a 4-input look-up table for performance of combinational logic (e.g., AND, OR, NOT, XOR, NAND, NOR, and many others) and a register that provides sequential logic features.

The LEs are arranged in groups of, for example, eight to form larger logic array blocks (LABs). The LABs contain, among other things, a common interconnection structure. The various LABs are arranged in a two-dimensional array, with the various LABs connectable to each other and to pins of the device though continuous lines that run the entire length/width of the device. These lines are referred to as row interconnect (GH) and column interconnect (GV) or "global" interconnect lines. In Altera's line of production these may include what are referred to as "Horizontal FastTracks™" and "Vertical FastTracks™."

The MAX® 7000 logic devices by way of contrast utilize what are commonly referred to as "macrocells" (analogous to LEs) as a basic logic element. The macrocells are arranged in groups of, for example, sixteen to form larger logic array blocks (LABs). A programmable interconnect array (PIA) selectively links together the multiple LABs. The PIA is a global bus that is fed by all dedicated inputs, I/O pins, and the various macrocells. The PIA is analogous to global interconnect, GHs and GVs. For example, the PIA may be fed by signals that will be used as logic inputs, global controls for secondary register functions in the LABs, input paths from I/O pins to registers that are used for setup of the device, etc.

Inputs to the LABs include inputs from pins (via I/O control blocks), the PIA, and various control (e.g. clock) pins. Logic inputs are provided to one or more of five AND devices, the outputs of which are provided to a product term select matrix. The product term select matrix selects which inputs will be provided to an OR or XOR function, or as secondary inputs to registers in the macrocell. Product terms may be shared between macrocells for complex logic functions. Outputs from the LABs are provided to the I/O control block to the PIA and/or various output pins.

The FLEX® and MAX® logic devices have met with substantial success and are considered pioneering in the area of programmable logic. While pioneering in the industry, certain limitations still remain. For example, the present invention recognizes that it would be desirable to further increase the flexibility of such devices to perform logic.

From the above it is seen that an improved programmable logic device and method of operation therefore is desired.

SUMMARY OF THE INVENTION

The present invention is a logic element or macrocell for a programmable logic device incorporating a lonely register feature so that combinatorial and registered functions may be implemented more efficiently in a single logic element. The logic element may also provide a shareable expander feature where logic modules and product terms in a particular LAB may be combined using a global interconnect with logic modules and product terms in other LABs within the programmable logic device. These features improve the overall utilization of the resources of the programmable logic device. Consequently, logic may be more densely packed in the PLD, and an individual PLD may be used to implement more complex functions and operations.

In particular, the logic element includes logic modules for implementing combinatorial logic and a register. The combinatorial and registered paths of a logic element may be utilized at the same time. The logic modules may be programmably coupled to the register. The output of the register may be programmably coupled through an output buffer to an I/O pad of the integrated circuit. The logic modules may bypass the register and directly programmably couple through the output buffer to the I/O pad. A logic module may also be used as a shareable expander by programmably coupling the module through to a global interconnect and combining it with other logic modules in LABs coupled to the global interconnect. By using a logic module as a shareable expander, the logic module may still be used for other functionality at the same time. In particular, the logic module may have a regular logic module output and a shareable expander output.

In accordance with the teachings of this invention, a logic element for a programmable logic device is disclosed. The logic element includes a first multiplexer which is directly coupled through an output buffer to an I/O pad of the programmable logic device. A plurality of logic modules or product terms is coupled to the first multiplexer. The logic modules may be programmably configured to implement combinatorial logic functions. A register may be programmably coupled to the first multiplexer and the plurality of logic modules. The register allows the implementation of registered functions. A particular logic module may be programmably coupled to the register while other logic modules are programmably coupled to the first multiplexer, bypassing the register.

Other objects, features, and advantages of the present invention will become apparent upon consideration of the following detailed description and the accompanying drawings, in which like reference designations represent like features throughout the figures.

DETAILED DESCRIPTION OF THE PREFERRED EMBODIMENTS

Figure 1:
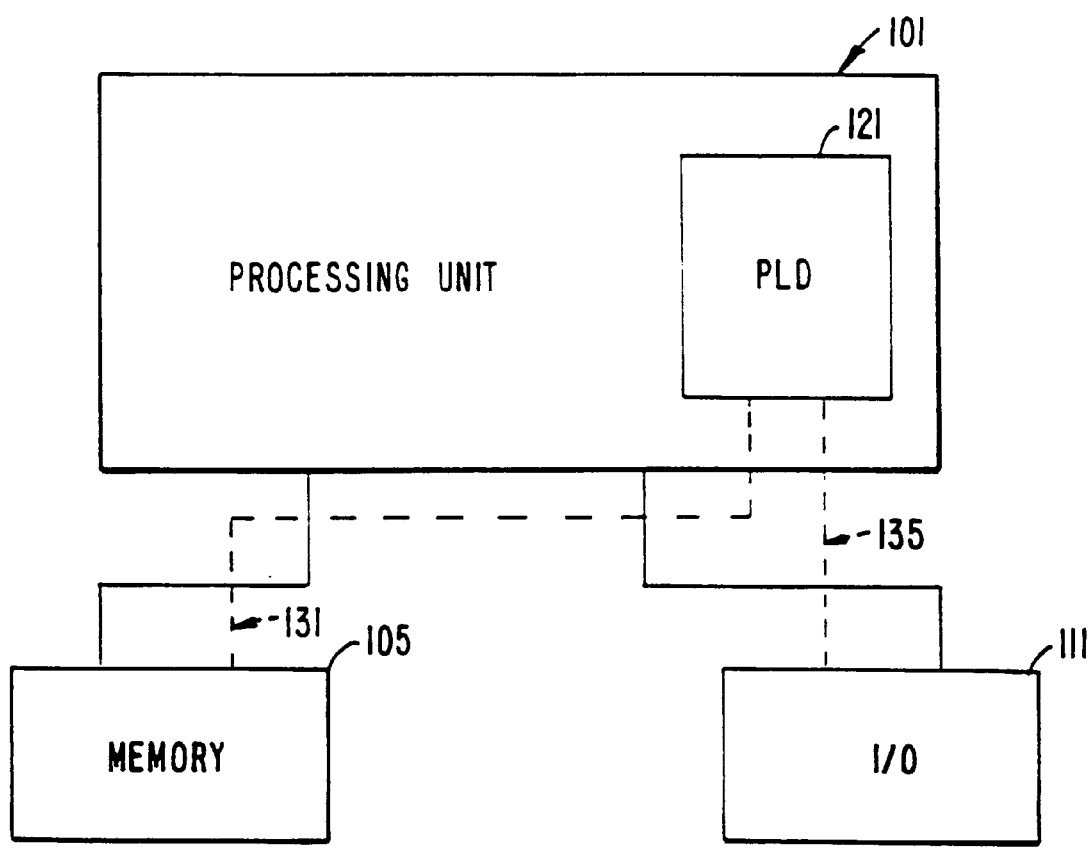
FIG. 1 is a diagram of a system incorporating a programmable logic device.

FIG. 1 shows a block diagram of a digital system within which the present invention may be embodied. The system may be provided on a single board, on multiple boards, or even within multiple enclosures. FIG. 1 illustrates a system 101 in which a programmable logic device 121 may be utilized. Programmable logic devices (sometimes referred to as a PALs, PLAs, FPLAs, PLDs, EPLDs, CPLDS, EEPLDs, LCAs, or FPGAs), are well know integrated circuits that provide the advantages of fixed integrated circuits with the flexibility of custom integrated circuits. Such devices allow a user to electrically program standard, off-the-shelf logic elements to meet a user's specific needs. See, for example, U.S. Pat. No. 4,617,479, incorporated herein by reference for all purposes. Such devices are currently represented by, for example, Altera's MAX® series of PLDs and FLEX® series of PLDs. The former are described in, for example, U.S. Pat. Nos. 5,241,224 and 4,871,930, and the *Altera Data Book*, June 1996, all incorporated herein by reference. The latter are described in, for example, U.S. Pat. Nos. 5,258,668, 5,260,610, 5,260,611 and 5,436,575, and the *Altera Data Book, June* 1996, all incorporated herein by reference for all purposes. Logic devices and their operation are well known to those of skill in the art.

In the particular embodiment of FIG. 1, a processing unit 101 is coupled to a memory 105 and an I/O 111 and incorporates a programmable logic device (PLD) 121. PLD 121 may be specially coupled to memory 105 through connection 131 and to I/O 111 through connection 135. The system may be a programmed digital computer system, digital signal processing system, specialized digital switching network, or other processing system. Moreover, such systems may be designed for a wide variety of applications such as, merely by way of example, telecommunications systems, automotive systems, control systems, consumer electronics, personal computers, and others.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, programmable logic device programmed for use as a controller, or other processing unit. Furthermore, in many embodiments, there is often no need for a CPU. For example, instead of a CPU, one or more PLDs 121 may control the logical operations of the system. In some embodiments, processing unit 101 may even be a computer system. Memory 105 may be a random access memory (RAM), read only memory (ROM), fixed or flexible disk media, PC Card flash disk memory, tape, or any other storage retrieval means, or any combination of these storage retrieval means. PLD 121 may serve many different purposes within the system in FIG. 1. PLD 121 may be a logical building block of processing unit 101, supporting its internal and external operations. PLD 121 is programmed to implement the logical functions necessary to carry on its particular role in system operation.

Figure 2:
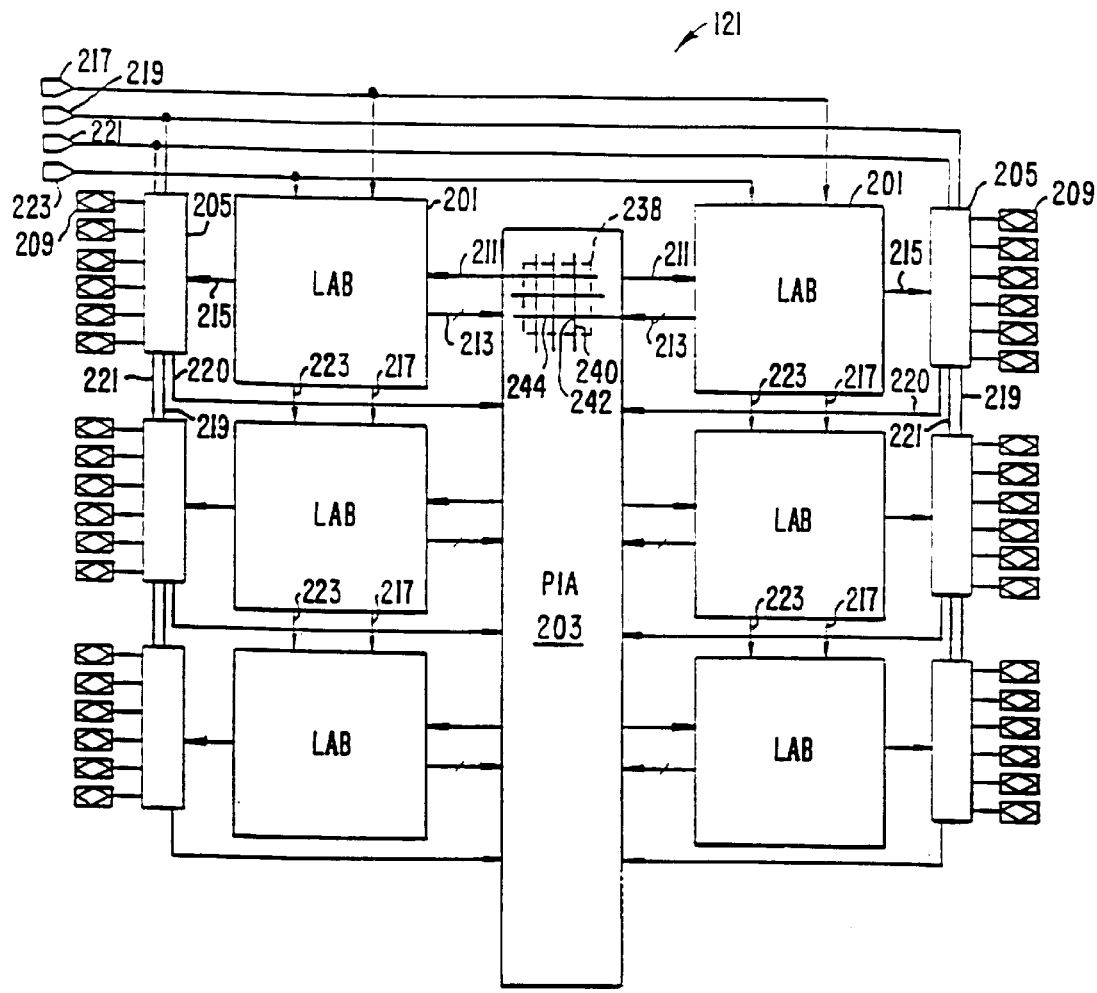
FIG. 2 is a block diagram showing the overall architecture of a programmable logic device incorporating the present invention.

FIG. 2 is a simplified block diagram of the overall internal architecture and organization of PLD 121 of FIG. 1. Many details of PLD architecture, organization, and circuit design are not necessary for an understanding of the present invention and such details are not shown in FIG. 2. PLD 121 includes, among other components, an array of logic array blocks (LABs) 201, a programmable interconnect array (PIA) 203, input-output blocks 205, and input-output pads 209.

In the particular embodiment shown in FIG. 2, PLD 121 includes a two-dimensional array of LABs 201, arranged in two columns of three LABs 201 for a total of six LABs. LAB 201 is a physically grouped set of logical resources that is configured or programmed to perform logical functions. The internal architecture of a LAB will be described in more detail below in connection with FIG. 3. PLDs may contain any arbitrary number of LABs, more or less than PLD 121 shown in FIG. 2. Generally, in the future, as technology advances and improves, programmable logic devices with even greater numbers of LABs will undoubtedly be created. Furthermore, LABs 201 need not be organized as shown in FIG. 2; for example, the array may be organized in a five-by-seven or a twenty-by-seventy matrix of LABs. These may also be an arrangement of 1-by-N LABs in a PLD, where N is an integer.

LABs 201 are connected to PIA 203 through inputs 211 and outputs 213. PIA 203 is a programmable or global interconnect array that facilitates the combination of multiple LABs 201 (and other components in the PLD) to form more complex, larger logic functions than can be realized using a single LAB 201. A very simplified view of PIA 203 is provided in dashed box 238. In this embodiment, PIA 203 is a two-dimensional array of conductors for routing signals between different LABs 201. A plurality of horizontal conductors 244 extends in a first direction, coupling to inputs 211 and outputs 213 of LABs 201. A plurality of vertical conductors 240 extends in a second direction, spanning the length of the PLD. The horizontal and vertical conductors are programmably connectable at intersections 242 of these conductors. Using PIA 203, a portion of LAB 201 in one location on the PLD may be programmably coupled to another LAB 201 in another location on the PLD.

PIA 203 may be implemented using many memory technologies. PIA may be constructed from programmable memory technologies such as, among others, dynamic random access memory (DRAM), static random access memory (SRAM), erasable read only memory (EPROM), fuses, and antifuses. In a specific embodiment, PIA 203 is implemented using electrically erasable programmable read only memory (EEPROM) cells or Flash EEPROM cells.

As discussed above, a PLD may contain more columns (and rows) of LABs than shown in FIG. 2. This type of architecture may be exemplified by Altera's Flex® and MAX 9000 series of products. In such circumstances, there may also be a PIA extending in a horizontal direction, analogous to PIA 203 which extends in a vertical direction. PIAs in the horizontal direction may be referred to as global horizontal interconnects (GHs), and when in the vertical direction, global vertical interconnects (GVs). In Altera's devices, these are sometimes referred to as Horizontal FastTracks™ and Vertical FastTracks™, and also as row and column interconnects. PIAs, GHs, and GVs provide an efficient technique of grouping and organizing the interconnection resources of the PLD.

There may be any number of GHs and GVs in a PLD, and each GH and GV may contain a plurality of individual conductors. For example, a PLD architecture may include three rows and three columns of LABs, where each row is separated by a GH and each column is separated by a GV.

In FIG. 2, signals from LABs 201 are coupled to I/O block 205. However, in other embodiments of the present invention, signals from LABs 201 may be programmably coupled through GHs and GVs to an appropriate I/O block 205. For example, these signals may pass directly to an I/O block 205 from the GH or GV, without needing to pass through another LAB 201.

The inputs and outputs to the LABs will be programmably connectable to the GHs and GVs in a similar fashion as described for PIA 203 above. Furthermore, at intersections of GHs and GVs, signal may be programmably coupled to another. For example, a signal may be programmable coupled from a LAB to a GV conductor and then to a GH conductor to another LAB in a different column. GHs and GVs conductors may be used to make multiple connections to other GHs, GVs, LABs, and I/O blocks. Utilizing GHs and GVs, multiple LABs 201 may be connected and combined to implement larger, more complex logic functions.

In still further embodiments of the present invention, using GHs and GVs, signals from a LAB 201 can be fed back into the same LAB 201. Selected GH conductors may only be programmably connectable to a selection of GV conductors. GH and GV conductors may be specifically used for passing signals in a specific direction, such as input or output, but not both. As can be appreciated, there are many other embodiments of the interconnection resources of the present invention.

A global clock signal 217 connects to LABs 201 to allow synchronous and sequential logic operations such as latches, registers, and counters. External, off-chip circuitry may be used to drive the global clock signal 217. Furthermore, a global clear signal 223 connects to LABs 201 to clear latches and registers within LABs 201. External, off-chip circuitry may be used to drive the global clear signal 223.

LABs 201 may output to PIA 203 through connections 213. Connections 213 may form part of a feedback loop from the LAB outputs back into PIA 203 to allow signals from one LAB 201 to be passed to the same LAB or other LABs 201. This feedback loop uses PIA 203 resources. Connections 211 may be used to input signals from PIA 203 into LAB 201.

LABs 201 may also output via connections 215 to input-output block 205. Input-output blocks 205 contain circuitry facilitating the connection of outputs 215 from LABs 201 to input-output pads 209 of the PLD. Through input-output blocks 205 and input-output pads 209, output signals from LABs 201 may be interfaced to external, off-chip circuitry. Furthermore, other internal PLD signals may be connected to external, off-chip circuitry by passing them through a LAB 201. Input-output blocks 205 also feedback outputs 215 of LABs 201 to PIA 203 through connections 220. This allows the output 215 of one LAB 201 to be coupled, via PIA 203, to itself or another LAB 201 in the PLD. Multiple LABs 201 may also be combined in this fashion.

In the embodiment shown in FIG. 2, input-output blocks 205 also have an output enable function, where the outputs at input-output pads 209 are enabled or disabled (or tristate). Output enable signals 219 and 221 are global signals, coupled to input-output block 205, for controlling whether specific outputs are enabled or disabled. Further, in other embodiments of the present invention there may be on-chip enable signals. These internal signals would control the output enable, possibly formed using the on-chip programmable logic and routed through PIA 203. Even further, there may be individual output enable signals for each or a portion of the outputs. Also, there may be a combination, where output enable is controlled, programmably selectable, either by a dedicated pin or an internal signal. Input-output block 205 are programmable to determine which input-outputs pads 209 are controlled (enabled or disabled) by which particular output enable signal, 209 or 221.

Furthermore, input-output blocks 205 are also programmably selectable to facilitate the passage of external, off-chip signals to circuitry internal to PLD 121. In this configuration, input-output blocks 205 act as input buffers, taking signals from input-output pads 209 and passing them to PIA 203 through connections 220. From PIA 203, these input signals can be programmably connected to LABs 201. In typical use, a portion of input-output pads 209 will be configured for use for input purposes and a portion will be configured for output purposes. There may also be some pins used as bidirectional pins which will dynamically change from input pins to output pins.

Figure 3:
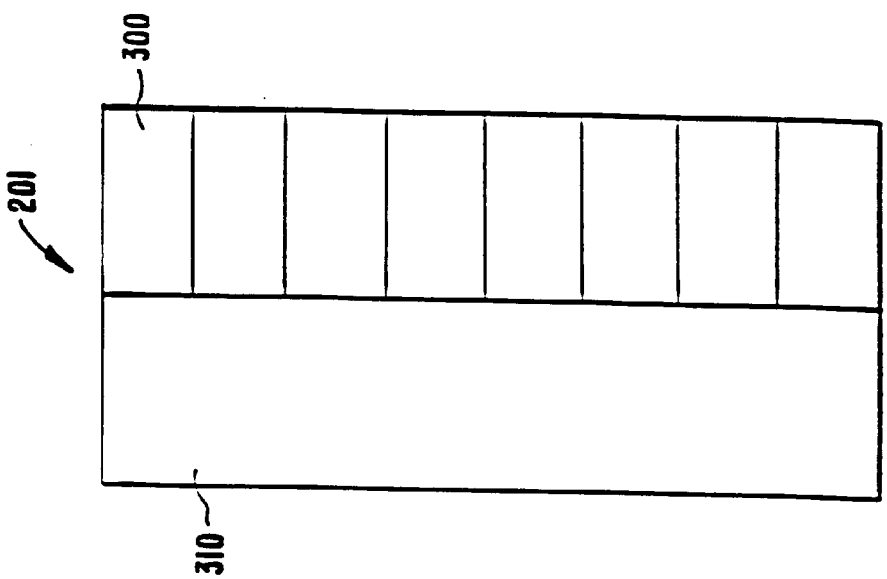
FIG. 3 is a simplified block diagram of a logic array block (LAB) of a programmable logic device.

FIG. 3 shows a simplified block diagram of LAB 201 of FIG. 2. LAB 201 is comprised of a varying number of logic elements (LEs) 300, sometimes referred to as "logic cells" or "macrocells." In one embodiment of LAB 201, there may also be a local (or internal) interconnect structure 310. The local interconnect is analogous to a local PIA. Some embodiments of LABs 201 do not include a local interconnect structure, but may use the PIA which receives any feedback outputs from the LEs. LAB 201 has eight LEs 300, but LAB 201 may have any number of LEs, more or less than eight. In some embodiments, LAB 201 includes carry chains.

A general overview of LE 300 is presented here, sufficient to provide a basic understanding of LAB 201. LE 300 is the smallest logical building block of a PLD. Signals external to the LAB, such as from horizontal conductors 244 and vertical conductors 240, are programmably connected to LE 300, and these interconnections may be through local interconnect structure 310, if available. However, LE 300 may be implemented and used in many architectures other than those shown in FIGS. 1–3. In one embodiment, LE 300 of the present invention incorporates a function generator that is configurable to provide a logical function of a number of variables, such a four-variable Boolean operation. As well as combinatorial functions, LE 300 also provides support for sequential and registered functions using, for example, D flip-flops. The function generator may be implemented using product terms, look-up tables, logic gates, logic modules, and others.

LE 300 provides combinatorial and registered outputs that are connectable to the interconnect resources (e.g., PIA 203), outside LAB 201. For example, outputs from LE 300 may be fed back to PIA 203 for routing to the same or other LABs 201. Furthermore, in some cases, the outputs from LE 300 may be internally fed back into local interconnect structure 310 (when available); through local interconnect structure 310, an output from one LE 300 may be programmably connected to the inputs of other LEs 300, without using PIA 203. Local interconnect structure 310 allows short-distance interconnection of LEs, without utilizing the limited global resources. Through local interconnect structure 310 and local feedback, LEs 300 are programmably connectable to form larger, more complex logical functions than can be realized using a single LE 300. Furthermore, because of its reduced size and shorter length, local interconnect structure 310 has reduced parasitics compared to the global interconnection structure. Consequently, local interconnect structure 310 generally allows signals to propagate faster than through the global interconnect structure.

Figure 4A:
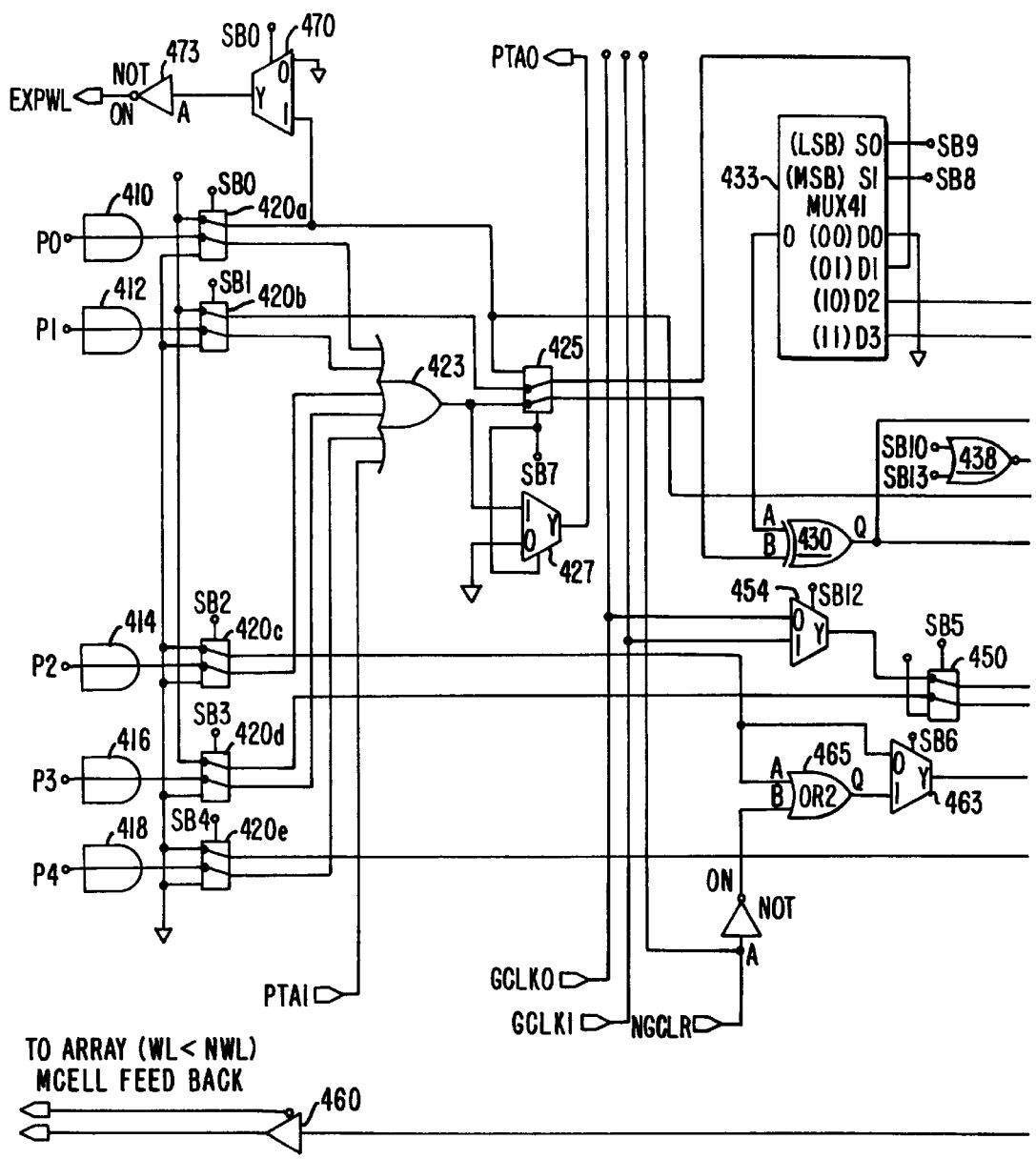
FIGS. 4A and 4B show a diagram of a logic element of the present invention incorporating a lonely register with an I/O structure architecture.
Figure 4:
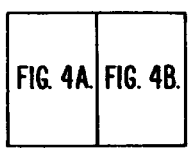
Figure 4B:
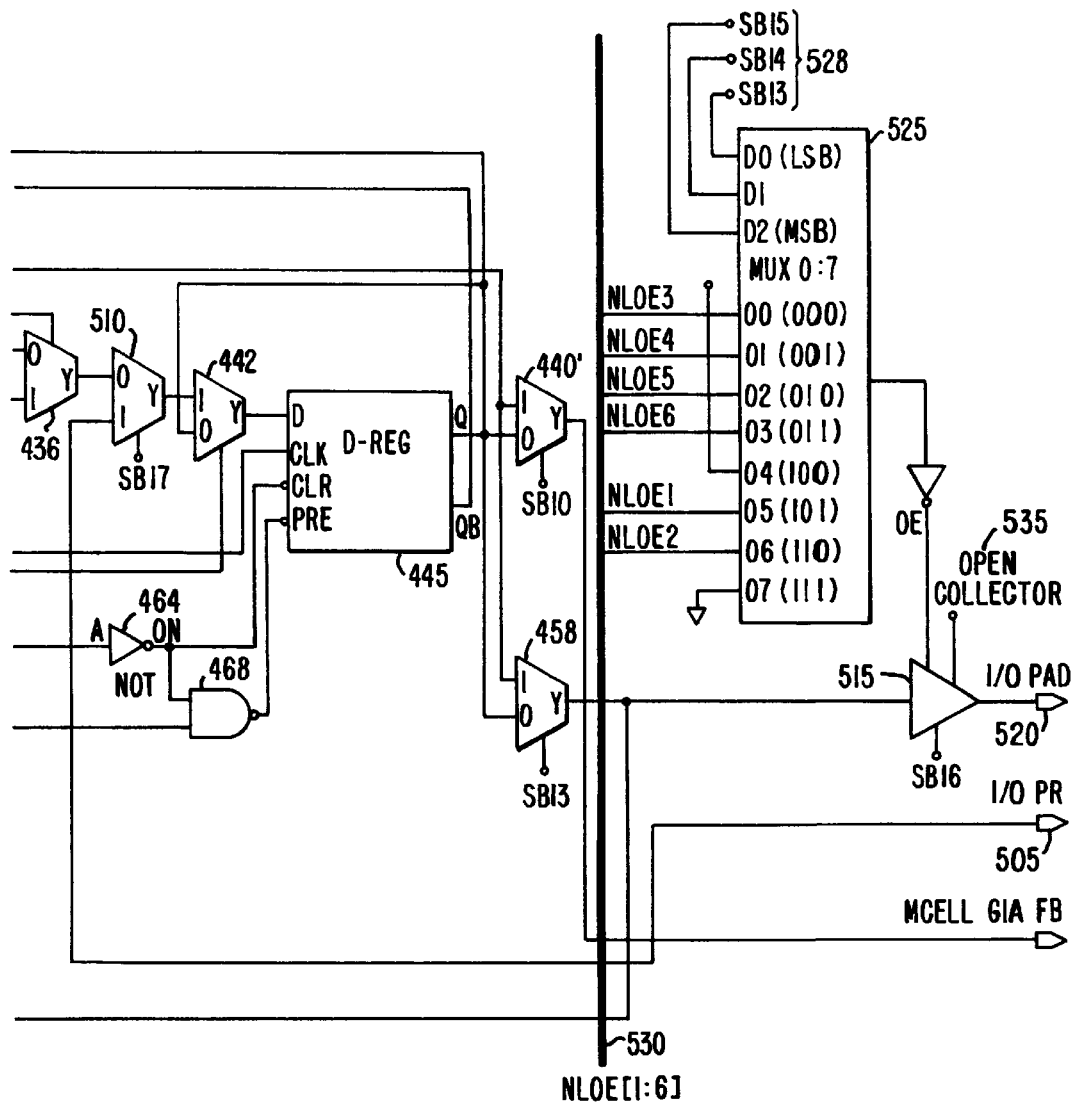

FIGS. 4A and 4B show a diagram of a logic element or macrocell of the present invention. The logic element includes a plurality of AND gates 410, 412, 414, 416, and 418. Each of the plurality of AND gates is associated with a respective plurality of inputs P0, P1, P2, P3, and P4, which may be referred to as product terms. Product terms and AND gates implement a type of logic module for performing logical functions. In this case, product terms P0–P4 provide programmable AND functionality. Depending on what inputs are programmable coupled to the products terms, different logic functions may be implemented. In further embodiments of the present invention, other types of logic modules may be used. These logic modules would provide other functionality including look-up tables, RAMs, FIFOs, registers, logic gates, and many others.

In the present invention, the product terms inputs may be programmably coupled to signals on the local interconnect of the LAB as well as the global interconnect and signals external to the LAB. For example, product term P0 may be coupled to a plurality of signals such as A1, A2, A3, . . . Ai as well as complements of these signals. An output of AND 410 would be an AND function of the inputs programmably coupled to AND gate 410.

The outputs of the AND gates are further coupled to a plurality of 3-to-2 multiplexers 420a–e. These multiplexers are used to programmably couple the product terms to other components in the LE. Each multiplexer is programmably controlled by way of a respective programmable bit (i.e., SB0, SB1, SB2, SB3, SB4). These programmable bits may be implemented using cells from RAM, DRAM, SRAM, EEPROM, FLASH, EPROM, fuse, antifuse, ferro-magnetic, and other technologies. For example, a programmable bit may comprise a plurality of SRAM or EEPROM cells. A first output of each multiplexer is coupled to an OR gate 423. For this first output, each multiplexer selects from one of two inputs, VSS or an output from a respective AND gate product term, to couple to OR gate 423. For example, multiplexer 420c may programmable couple the output from AND gate 414 (product term P2) to an input of OR gate 423. Using multiplexers 420a–e, inputs to OR gate 423 may also be programmably coupled to VSS, which may be used to disable an unused input of OR gate 423. An input PTAI to OR gate 423 is a logical output from a different LE. In a specific embodiment, PTAI is an output from an OR gate in a neighboring LE. This path allows interconnections of the logic elements without using the local or global interconnect.

As those of skill in the art will recognize, by using the programmable AND gates and OR gate of the present invention, many different logic functions may be programmably implemented. In other embodiments of the invention, however, logic functions may also be programmably performed using other types of components and logic modules including NAND gates, OR gates, XOR gates, look-up tables, flip-flops, registers, FIFOs, RAMs, and SRAMs, to name a few.

A second output from multiplexer 420a, a second output from multiplexer 420b, and an output from OR gate 423 is coupled to a multiplexer 425. Multiplexer 425 is controlled by way of a programmable bit SB7. The output of OR gate 423 is also coupled to a multiplexer 427, which is also controlled by programmable bit SB7. Multiplexer 427 couples VSS or the output of OR gate 423 to PTA0, which passes logical information to other logic elements, without needing to use the local or global interconnect. In a specific embodiment, PTAØ couples to only one other logic element.

Depending on a state of programmable bit SB0, the second output from multiplexer 420a programmable couples VDD or the output of AND gate 410 to multiplexer 425. Similarly, depending on a state of programmable bit SB1, multiplexer 420b couples VDD or the output of AND gate 411 to multiplexer 425. For example, product term P0 may be programmable coupled through multiplexer 420a to multiplexer 425. A first output from multiplexer 425 is used to programmably couple OR gate 423 or multiplexer 420b to an XOR gate 430. A second output from multiplexer 425 is used to programmably couple multiplexer 420a or multiplexer 420b to a 4-to-1 multiplexer 433. An output of 4-to-1 multiplexer 433 is coupled to an input of XOR gate 430. An output from XOR gate 430 is coupled to multiplexer 436. XOR gate 430 performs an XOR of the output of OR gate 423 and the output of multiplexer 433. Among other functional and logical uses, XOR gate 430 may be used to invert the polarity of logic. For example, XOR gate 430 may invert the output of OR gate 423 before passing the output signal to other components in the logic element. Multiplexer 436 is also coupled to the second output of multiplexer 420a. Multiplexer 436 is controlled by way of an NOR 438 of programmable bits SB10 and SB13.

The second output of multiplexer 420a may also be programmably coupled through a multiplexer 470 and an inverter 473 to generate an EXPWL signal. This is a shareable expander feature. Shareable expanders may also be used to implement NAND and logic, which provides further logical capabilities when ANDed into the product terms for another logic array block. The EXPWL signal feeds back to the local interconnect of the LAB to enable the creation of expanded logical functions. For example, product term P0 may be further combined with other product terms of other LEs in the LAB. In such a fashion, shareable expanders allows product terms to be expanded by sharing them among the LEs in a LAB. This feature allows logic cells to use uncommitted product terms and share them among other product terms in the LAB. Thus, improves the overall efficiency in utilizing the resources of the programmable logic device. The EXPWL signal may also be coupled through another LE to the global interconnect to allow expanded product terms across different LABs. Controlled by way of a programmable bit SB0, multiplexer 470 may also be used to provide a VDD for the EXPWL signal (i.e., VSS passes through multiplexer 470 and inverter 473) when the shareable expander feature is not used. Inverter 473 provides some buffering between the components.

The output from XOR gate 430 is further coupled to a 2-to-1 multiplexer 440. An output from multiplexer 440 may be coupled to the global interconnect (i.e., PIA). In further embodiments of the present invention, multiplexer 440 may also be coupled to the local interconnect of a LAB. For example, XOR gate 430 may be programmably coupled through multiplexer 440 and a horizontal conductor to provide logical signals for other LABs and LEs. Furthermore, the output of multiplexer 440 may be connected to PIA 203 and programmably coupled to access LABs 201 through inputs 211. Therefore, the outputs for multiplexers 440 from LABs 201 of the PLD would be available in PIA 203 for coupling to LABs 201 and LEs 300.

Multiplexer 436 may be programmably coupled through a multiplexer 510 and a multiplexer 442 to an input of a register 445. Multiplexer 510 is controlled by a programmable bit SB17. Via multiplexer 510, an I/O pad 505 may be directly, programmably coupled to the input of register 445. I/O pad 505 may be a separate I/O pad for this purpose, or a multipurpose shared pad. Furthermore, multiplexer 510 may be optionally omitted in certain embodiments. In those embodiments, multiplexer 436 would be directly coupled to multiplexer 510.

In a preferred embodiment, register 445 is a D-type register and multiplexer 442 is coupled to a D input of register 445. The D input is used for inputting data. However, in other embodiments of the present invention, other types of storage blocks may be used for register 445 including various types of latches, flip-flops, registers, memory cells, and many others. For example, register 445 may be a T flip-flop, S-R flip-flop, J-K flips-flop, or transparent latch.

A Q output of register 445 may be feed back through multiplexer 442 to the D input. The Q output may fed back to XOR gate 430 through 4-to-1 multiplexer 433, programmably controlled by programmable bits SB8 and SB9. The Q output may be coupled through multiplexer 440 to the global interconnect. A QB output of register 445 may programmably feedback through 4-to-1 multiplexer 433 to XOR gate 430. The QB output is the complement of the Q output.

The Q output or output of XOR gate 430 is coupled to a tristateable output buffer 515 through a 2-to-1 multiplexer 458, programmably controlled by programmable bit SB13. Through tristateable output buffer 515, data may be coupled to an I/O pad 520, where signals may be utilized by other components in the system. A tristate control of output buffer 515 is controlled by an 8-to-1 multiplexer. Controlled by way of programmable bits 528, multiplexer selects a tristate control signal from a plurality of NLOE enable lines 530. Furthermore, tristateable output buffer 515 may be programmably enabled and disabled. Output buffer 515 may also be programmably configured via a programmable bit 535 to implement an open collector output. Further, through multiplexer 458, the Q output or the output of XOR gate 430 may be fed back to the local interconnect of the LAB. This path from XOR gate 430 bypasses register 445. Multiplexer 458 may couple to the local interconnect of a LAB without needing to utilize the global interconnect. The path also includes a buffer 460 to provide the true and complement of the particular signal to the local interconnect. This allows greater flexibility when implementing logical functions.

A CLK input of register 445 is used for clocking. A first output of a multiplexer 450, controlled by way of programmable bit SB5, is used to couple a second output of multiplexer 420*d* or an output of multiplexer 454 to the CLK input. Through multiplexer 420*d*, product term P3 or VDD may be used to programmably control the CLK input. Alternatively, global clock signals GCLK0 or GCLK1 may be used to control the CLK input through multiplexer 454, programmably controlled by a programmable bit SB12. In a preferred embodiment, the global clock signals may be connected to a plurality of LABs and LEs on the chip through direct, dedicated lines without need to couple through the global and local interconnect.

A second output of multiplexer 450 is used to control the selection of multiplexer 442, which determines the D input of register 445. Product term P3 or VDD may be used to control the selection of multiplexer 442.

A CLR input is used to clear register 445. In a preferred embodiment, CLR is active low. A multiplexer 463, controlled by a programmable bit SB6, couples a second output of multiplexer 420*c* or an output of OR gate 465 through an inverter 464 to the CLR input. Through multiplexer 420*c*, product term P2 or VSS may be coupled to control the CLR input. Alternatively, via OR gate 465, the second output of multiplexer 420*c* may be ORed with an inverse of an NGCLR signal to control the CLR input. The NGCLR signal may be used as a global signal to implement a global clear signal to clear a plurality of registers 445 for a plurality of LEs.

A PRE input is used to preset register 445. In a preferred embodiment, the PRE input is active low. The PRE input is controlled using a second output from multiplexer 420*e*. Through multiplexer 420*e*, product term P4 or VSS may be programmably coupled to control the PRE input. Moreover, the CLR input may "override" the PRE input. To implement this, in a specific embodiment, the PRE input is coupled to an output of a NAND gate 468. NAND gate 468 has an input from an output of inverter 464 and an input from a second output of multiplexer 420*e*. Other embodiments may use different logical and circuit configurations to implement these functions.

The present invention implements a lonely register architecture in an LE or macrocell. When programmable logic devices are used, often, some LEs are used for combinatorial logic and some LEs are used for registered logic. However, it is inefficient to use an LE solely to implement a registered function (i.e., a lonely register). Therefore, the present invention allows these types of logical function to be implemented in a PLD more efficiently. In particular, the architecture in FIGS. 4A and 4B allows the combinatorial paths to used at the same time the registered paths are used. For example, a combinatorial path from the output of OR gate 423 may be passed through XOR gate 430, bypass register 445, and programmably couple to the I/O pad, global interconnect, and local interconnect. A registered path from the Q output of register 445 may be used to programmably couple data to the I/O pad, global interconnect, and local interconnect. By appropriately configuring the programmable bits, some paths may be used for registered data at the same time other paths are used for combinatorial data. This allows more efficient implementation of logical functions in a PLD.

For example, product term P0 may be used as the D input into register 445 (via multiplexer 436). The other product terms may be used for combinatorial logic. Multiplexers 440 and 458 programmably select to pass the registered combinatorial output to the appropriate interconnect or I/O pad. Multiplexer 440 may programmably couple data signals to the global interconnect, while multiplexer 458 may programmably couple signals to the I/O pad and local interconnect. Multiplexer 458 may interconnect to the local interconnect or PIA by expanding the local interconnect or PIA to include the output of multiplexer 458; this does not require a new dedicated line. The output of multiplexer 458 may be coupled to other multiplexers in much the same way other PIA lines are. In particular, when multiplexer 459 goes to the PIA region and then reconnects to LAB 201 via the same method that the PIA lines are, buffer 460 is not necessary in the case when PIA lines feed their own dual-output buffer.

For example, when programmable bits SB10 and SB13 are both in a first state, product term P0 is programmably coupled to the D input of register 445. Multiplexer 440 selects a combinatorial output from the XOR gate 430, which may be coupled to the global interconnect. Multiplexer 458 also selects the combinatorial output from the XOR gate 430, which may be coupled to the local interconnect or I/O pad, or both.

When programmable bit SB10 is in a second state and programmable bit SB13 is in the first state, product term P0 is programmably coupled to the D input of register 445. Multiplexer 440 selects a registered output from the Q output of register 445, which may be coupled to the global interconnect. Multiplexer 458 selects the combinatorial output from the XOR gate 430, which may be coupled to the local interconnect or I/O pad, or both.

When programmable bit SB10 is in the first state and programmable bit SB13 is in a second state, product term P0 is programmably coupled to the D input of register 445. Multiplexer 440 selects the combinatorial output from the XOR gate 430, which may be coupled to the global interconnect. Multiplexer 443 selects the registered output from the Q output of register 445, which may be coupled to the local interconnect or I/O pad, or both.

When programmable bit SB10 is in the second state and programmable bit SB13 is in the second state, the output of XOR gate 430 may be coupled to the D input of register 445. Multiplexer 440 selects a registered output from the Q output of register 445, which may be coupled to the global interconnect. Multiplexer 443 selects the registered output from the Q output of register 445, which may be coupled to the local interconnect or I/O pad, or both.

The implementation shown in FIGS. 4A and 4B merely illustrates the principles of the present invention, and many various circuit embodiments are possible. For example, a global shareable expander path or local shareable expander path may also be implemented within configuration of the LE of FIGS. 4A and 4B.

The foregoing description of preferred embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. It is intended that the scope of the invention be defined by the claims appended hereto.

What is claimed is:

1. A logic element for a programmable integrated circuit comprising:

a plurality of combinatorial outputs from logic modules programmably configurable to perform logic;

a register comprising a data input and a data output;

a first multiplexer comprising a first input coupled to the data output and a second input coupled to the plurality of combinatorial outputs;

a second multiplexer to programmably couple the plurality of combinatorial outputs to the data input to the register; and a third multiplexer to programmably couple an I/O pad or an output from the second multiplexer to the data input of the register, wherein the I/O pad may be directly coupled to the data input of the register without using a programmable interconnect line of the programmable integrated circuit.

2. The logic element of claim 1 wherein an output of the first multiplexer is directly coupled to an I/O pad without passing through a programmable interconnect line of the programmable integrated circuit.

3. The logic element of claim 1 wherein control of the first and second multiplexer is by way of programmable bits.

4. The logic element of claim 1 further comprising:

a fourth multiplexer to programmably couple an output of the third multiplexer or the data output of the register to the data input of the register.

5. The logic element of claim 1 wherein the logic modules comprise programmable AND gates.

6. The logic element of claim 1 further comprising:

an OR gate coupled to outputs of the plurality of combinatorial outputs.

7. The logic element of claim 1 wherein the second multiplexer programmably couples the plurality of combinatorial outputs or an output from a shareable expander logic module to the data input.

8. The logic element of claim 1 further comprising:

a fourth multiplexer coupled to the plurality of combinatorial outputs and a second data output of the register, wherein the second data output is an inverted version of the first data output.

9. The logic element of claim 8 further comprising:

a fifth multiplexer to programmably couple an output of the third multiplexer or the data output of the register to the data input of the register.

10. The logic element of claim 1 wherein an output of the third multiplexer is coupled to the second multiplexer.

11. A logic element for a programmable integrated circuit comprising:

a plurality of combinatorial outputs from logic modules programmably configurable to perform logic;

a register comprising a data input and a data output;

a first multiplexer comprising a first input coupled to the data output and a second input coupled to the plurality of combinatorial outputs;

a second multiplexer to programmably couple the plurality of combinatorial outputs to the data input to the register; and a third multiplexer coupled to the plurality of combinatorial outputs and a second data output of the register, wherein the second data output is an inverted version of the first data output.

12. The logic element of claim 11 wherein the second multiplexer programmably couples the plurality of combinatorial outputs or an output from a shareable expander logic module to the data input.

13. The logic element of claim 11 wherein an output of the first multiplexer is directly coupled to an I/O pad without passing through a programmable interconnect line of the programmable integrated circuit.

14. The logic element of claim 11 wherein control of the first and second multiplexer is by way of programmable bits.

15. The logic element of claim 11 wherein the logic modules comprise programmable AND gates.

16. The logic element of claim 11 further comprising:

an OR gate coupled to outputs of the plurality of combinatorial outputs.

17. The logic element of claim 11 wherein an output of the third multiplexer is coupled to the second multiplexer.

* * * * *